United States Patent [19]

Grün et al.

[11] 3,912,916

[45] Oct. 14, 1975

[54] ELECTRICAL CURRENT FREQUENCY FILTER CIRCUIT HAVING PARALLEL FILTER BRANCHES

[75] Inventors: Artur Grün, Erlangen; Ernst-Robert Paessler, Tennenlohe; Kurt Smutny, Erlangen, all of Germany

[73] Assignee: Siemens Aktiengesellschaft, Munich, Germany

[22] Filed: Mar. 28, 1974

[21] Appl. No.: 455,893

[30] Foreign Application Priority Data

Apr. 2, 1973 Germany ........................... 2316436

[52] U.S. Cl. .................................. 235/152; 328/167

[51] Int. Cl.[2] ........................................... H03B 1/04

[58] Field of Search ............ 235/152, 156; 328/167, 328/165; 333/70 A

[56] References Cited

UNITED STATES PATENTS

| | | | |
|---|---|---|---|
| 3,307,408 | 3/1967 | Thomas et al. | 328/167 X |
| 3,493,876 | 2/1970 | Zimmerman | 328/167 |
| 3,628,163 | 12/1971 | Heibel | 328/167 |
| 3,659,212 | 4/1972 | Saliga | 328/167 |

*Primary Examiner*—David H. Malzahn
*Attorney, Agent, or Firm*—Kenyon & Kenyon Reilly Carr & Chapin

[57] ABSTRACT

A filter circuit which comprises first and second parallel coupled filter branches each including a first multiplier, an intermediate frequency filter, and a second multiplier, respectively, coupled in series. A signal generator generates two output signals which are linearly independent of each other at a frequency which is equal to that of an input signal which is to be passed by the filter branches, and has a pair of output terminals coupled to the first multipliers of the filter branches for transmitting these output signals thereto. An adder is coupled to the second multipliers of the filter branches and generates an output signal which forms the output signal of the filter circuit. An adjustable signal feedback means is coupled to the output of the adder and to the inputs of the first multipliers of the filter branches for adjusting the bandwidth of the filter circuit.

In an alternative embodiment of the invention, two pairs of identical filter branches are series coupled to form the filter circuit, with the adder of the second pair of filter branches generating the output signal of the filter circuit and being coupled to the signal feedback means of the circuit.

14 Claims, 2 Drawing Figures

ELECTRICAL CURRENT FREQUENCY FILTER CIRCUIT HAVING PARALLEL FILTER BRANCHES

BACKGROUND OF THE INVENTION

1. Field of the Invention

This invention relates generally to current frequency filter circuits, and in particular to a frequency filter consisting of parallel coupled filter branches each consisting of a first multiplier, an intermediate frequency filter, and a second multiplier, respectively, coupled in series relationship.

2. Description of the Prior Art

Frequency filters of the above-described type are known in the art. See *Electronics Letters*, Vol, 7, No. 12, June 17, 1971, pp. 349–351. They are characterized as having a stable center band frequency and a narrow bandwidth. However, narrow bandwidth filters generally have slow rise times and are thus unsuitable for some applications, such as their use in power line carrier systems.

SUMMARY OF THE INVENTION

It is therefore an object of the invention to provide an improved frequency filter of the above described type which overcomes the aforementioned disadvantages of the prior art filter circuits, and which has an adjustable bandwidth and rise time.

These and other objects of the invention are achieved by the provision of a filter circuit comprising first and second parallel coupled filter branches which each consist of a first multiplier, an intermediate frequency filter, and a second multiplier coupled in series relationship; a first signal generator which includes first and second output terminals coupled to the first and second multipliers of the filter branches, respectively, and which generates a pair of output signals which are linearly independent of each other at a frequency equal to that of an input signal to be passed by the filter branches for transmission to the first multipliers; a first adder coupled to the second multiplier of both filter branches, which generates an output signal forming the output signal of the filter circuit; and an adjustable signal feedback means coupled to the adder and to the first multipliers of the filter branches, for adjusting the bandwidth of the filter circuit.

In an alternative embodiment of the invention, a second pair of filter branches, identical to those comprising the first and second filter branches, may be coupled in series relationship therewith and a second adder which generates the output signal of the filter circuit. In this alternative embodiment, the first adder is coupled to the first multipliers of the second pair of filter branches, and the second adder is coupled to the first multipliers of the first and second filter branches through the signal feedback means.

In either embodiment of the inventive circuit, the feedback means may comprise an adjustable reference signal voltage source, and a third multiplier coupled thereto and to the adder generating the output signal of the filter circuit. These and other inventive features of the inventive filter circuit will be described later on herein in the following detailed description.

DETAILED DESCRIPTION

Figures 1, 2:
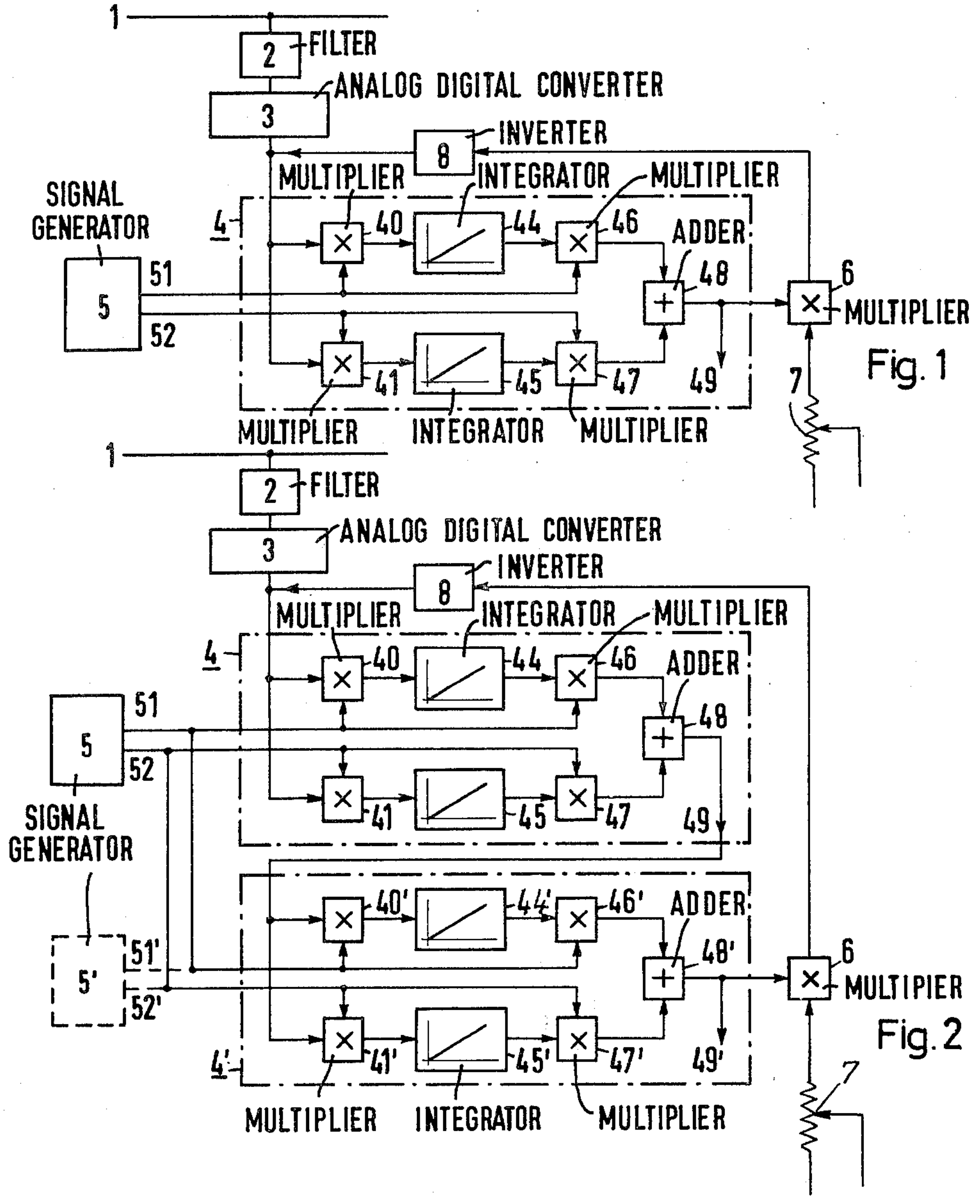
FIG. 1 is a schematic circuit diagram of a filter circuit constructed according to the invention.
FIG. 2 is a schematic circuit diagram of another embodiment of a filter circuit constructed according to the invention.

Referring now to the drawings, there is shown in FIG. 1 an electrical current frequency filter circuit, generally denoted 4, which includes first and second parallel coupled filter branches. The first filter branch comprises a first multiplier 40, an intermediate frequency filter 44, and a second multiplier 46, coupled in series. Likewise, the second filter branch comprises a first multiplier 41, an intermediate frequency filter 45, and a second multiplier 47, coupled in series. In the embodiment of the invention illustrated, frequency filters 44 and 45 comprise integrators. A first signal generator 5 generates two output signals which are linearly independent of each other at a frequency which is equal to that of an input signal which is to be passed by the first and second filter branches. Generator 5 has two output terminals 51 and 52 coupled to first and second multipliers 40 and 46, and 41 and 47, respectively, which transmit the generator output signals to the first and second filter branches. As stated above, the two output signals of generator 5 are linearly independent, i.e., the two signals are shifted in phase with respect to each other by a predetermined angle. For example, if the phase shift of the signals is 90°, the output signal transmitted by terminal 51 can be a sine wave and that transmitted by terminal 52 can be a cosine wave. Two linearly independent electrical signals are thus always separately transmitted by the signal generator to the first and second filter branches, respectively.

A first adder 48 is coupled to second multipliers 46 and 47 for summing the output signals of the first and second filter branches, and generates the output signal of filter circuit 4, the output terminal of which is schematically designated 49. An adjustable signal feedback means, illustrated as a third multiplier 6, and an adjustable reference signal voltage source, schematically illustrated at 7 and which may, for example, comprise a potentiometer, is coupled to adder 48 and first multipliers 40 and 41 of the first and second filter branches. By adjustment of the voltage level of the reference signal generated by source 7, the bandwidth of filter circuit 4 may be adjusted. The feedback output of multiplier 6 is coupled to the inputs of first multipliers 40 and 41 through an inverter 8, and incoming signals of various frequencies are transmitted to filter circuit 4 from a transmission line 1 through a preselector filter 2 which passes those frequencies corresponding to the parasitic resonance points of filter circuit 4, and an analog-to-digital converter 3, coupled to filter 2 and first multipliers 40 and 41, for changing the analog input signals from transmission line 1 to digital form. It should be noted, however, that converter 3 may be dispensed with if the multipliers and integrators making up the first and second filter branches are analog in nature, instead of digital, as illustrated. Where integrated circuits are utilized to fabricate the multipliers and frequency filters of the filter branches, the analog-to-digital converter would be included in the circuit for transforming the input signals from line 1.

FIG. 2 shows an alternate embodiment of the invention in which a second filter circuit, generally denoted 4', is coupled in series relationship with filter circuit 4. The second circuit comprises third and fourth filter branches consisting of first multipliers 40' and 41', intermediate frequency filters 44' and 45', and second multipliers 46' and 47', respectively, coupled in series. Output terminals 51 and 52 of generator 5 are coupled to the first and second multipliers of the third and fourth filter branches in the same fashion as their connection to the multipliers of the first and second filter branches. A second adder 48' is coupled to multipliers 46' and 47' and generates an output signal which forms the output of the filter circuit comprising circuits 4 and 4', the output terminal of which is schematically designated at 49'. As in the previously described embodiment of the invention, frequency filters 44' and 45' comprise integrators.

In lieu of connecting signal generator 5 to multipliers 40', 41', 46' and 47' in the third and fourth filter branches, a separate second signal generator 5' may be provided. Like generator 5, it generates two output signals which are linearly independent of each other at a frequency which is equal to that of an input signal which is to be attenuated by the third and fourth filter branches. However, the frequency of the signals generated by generator 5' is different from that of the signals generated by generator 5. Where second signal generator 5' is provided, the illustrated connection between lines 51, 52 and 51', 52' is, of course, omitted. Either generator may comprise a variable frequency signal generator.

The adjustable signal feedback means comprises, as in the previously described embodiment, a multiplier 6 coupled to adder 48' and an adjustable reference signal voltage source 7.

In operation of the filter circuit of FIG. 1, incoming signals are fed from transmission line 1 through filter 2 and converter 3 to the multipliers 40 and 41 of the first and second filter branches. The first multipliers multiply the input signals by the resonance frequency generated by signal generator 5. Since, as previously noted, the signals generated by generator 5 are linearly independent, the output signals of converter 3 do not have to be synchronized with the output signals of generator 5. The product of the incoming signals and the resonance frequency generated by generator 5 is then transmitted to frequency filters 44 and 45 which integrate the product. These filters are designed so that a signal having a magnitude which is other than zero, appears at the output thereof only when the product signal input thereto is formed by signals having approximately equal frequencies. That is to say, a signal different from zero, i.e., an output, appears at the output of integrators 44 and 45 only when the incoming signals from converter 3 have a frequency which is approximately equal to the frequency of the output signals of generator 5. A signal thus appears at the output of second multipliers 46 and 47 also only if the input signals to the first multipliers have approximately equal frequencies. Incoming signals at frequencies other than that at which the signal generator signals are generated are thus attenuated. The signal output of integrators 44 and 45 is representative of a coefficient of the frequency components formed in the first and second filter branches of the circuit. This coefficient is multiplied in second multipliers 46 and 47, and the signals appearing at the output of the latter are combined in adder 48 to produce the circuit output at terminal 49.

The feedback from the adder to the first multipliers of the circuit may be either positive or negative. However, since the frequency filters 44 and 45 of the circuit illustrated in FIG. 1 comprise integrators, the signal feedback must be negative due to the nearly infinite gain of the integrators in response to d-c input signals. By multiplying the output signal of adder 48 in multiplier 6 by an adjustable reference signal generated by source 7, a weighing of the output for the negative signal feedback is achieved. The negative feedback transmission of the adder output to the first multipliers is effected by means of inverter 8. Adjustment of the bandwidth of the filter circuit is achieved by means of adjustment of the reference signal voltage at source 7.

The filter circuit illustrated in FIG. 2 operates in exactly the same manner as the above circuit except for the following described differences. The output signal of filter circuit 4 at adder 48 is transmitted as the input signal to the second filter circuit instead of being fed back to the first multipliers of circuit 4. This cascade type arrangement of filter circuits, in which the output of the second filter circuit is negatively fed back to the input of the first filter circuit, increases the resonance step-up and bandwidth of the filter circuit. Moreover, an increase in the bandwidth can also be achieved by using a separate signal generator (5') as previously described, instead of merely a single signal generator (5). If variable frequency signal generators are utilized, i.e., signal generators having a variable division ratio, particular advantage is obtained in that the filter circuit can be adjusted to pass the desired frequency after fabrication of the circuit. Since this frequency may vary depending on the application of the circuit, inventories of filter circuits which pass signals of different frequencies can be eliminated, and mass production of the circuits is facilitated.

In both embodiments of the invention, the output signals of the signal generators may have a waveshape wherein the signals periodically have an amplitude of zero for a definite time interval. The null errors of the elements of the filter branches, i.e., the multipliers and integrators, are preferably measured and corrected during this time interval. Also, integrators forming the intermediate filters of the filter branches are designed so that they are reset by a predetermined value once an integration limit is reached thereby. The number of resets of the integrators is then added up, considering the sign of the reset. The output signals of the integrators then correspond to the sum of the respective integration limits and the summed number of resets thereof. with such a design, the capacitors of the integrators can be made substantially smaller.

The frequency filter of the invention is particularly suited to multi-channel communication line applications, which are generally characterized by narrow frequency band individual channels. Such narrow frequency bands require filters having a resonance frequency which is subject to slight variation. In the circuit of the invention, the range of variation of the circuit resonance frequency is determined by the frequency stability of the signal generator, which is ensured by using a quartz stabilized signal generator. The resonance frequency is derived from the quartz frequency by frequency division.

The inventive filter circuit is characterized by the high selectivity of an L-C filter, as well as high stability of its center frequency and high Q at low signal frequencies. If the intermediate frequency filters of the filter branches are adequately damped, the output thereof may be fed to the input of the second multipliers instead of the output signals generated by the signal generators. The multipliers then generate the square of the intermediate frequency filter output. The output of the adder summing the signals of the filter branches is then a signal which corresponds approximately to the square of an L-C filter demodulated signal.

In the foregoing specification, the invention has been described with reference to specific exemplary embodiments thereof. It will, however, be evident, that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. An electrical current frequency filter circuit, comprising:

first and second parallel coupled filter branches, each of said filter branches including a first multiplier, an intermediate frequency filter, and a second multiplier, respectively, coupled in series;

a first signal generator having first and second output terminals coupled to said first and second multipliers of said first and second filter branches, respectively, said signal generator generating two output signals which are linearly independent of each other at a frequency which is equal to that of an input signal to be passed by said filter branches;

a first adder, coupled to said second multipliers of said first and second filter branches, the output signal generated by said adder forming the output signal of said filter circuit; and adjustable signal feedback means, coupled to said adder and to said first multipliers of said first and second filter branches, for adjusting the bandwidth of said filter circuit.

2. The filter circuit recited in claim 1, wherein said adjustable signal feedback means comprises an adjustable reference signal voltage source, and a third multiplier having the input terminals thereof coupled to said adder and said reference signal voltage source, and the output terminal thereof coupled to said first multipliers of said first and second filter branches.

3. The filter circuit recited in claim 1, wherein said intermediate frequency filters comprise integrators.

4. The filter circuit recited in claim 1, further comprising an analog-to-digital converter, coupled in series between a signal input transmission line and said first multipliers of said first and second filter branches.

5. An electrical current frequency filter circuit, comprising:

first and second parallel coupled filter branches, each of said filter branches including a first multiplier, an intermediate frequency filter, and a second multiplier, respectively, coupled in series, a first signal generator having first and second output terminals coupled to said first and second multipliers of said first and second filter branches, respectively, said signal generator generating two output signals which are linearly independent of each other at a frequency which is equal to that of an input signal to be passed by said filter branches, a first adder, coupled to said second multipliers of said first and second filter branches, third and fourth parallel coupled filter branches, each of said filter branches including a first multiplier, an intermediate frequency filter, and a second multiplier, respectively, coupled in series, said first and second output terminals of said signal generator also being coupled to said first and second multipliers of said third and fourth filter branches, respectively, a second adder, coupled to said second multipliers of said third and fourth filter branches, the output signal generated by said second adder forming the output signal of said filter circuit, said first adder being coupled to said first multipliers of said third and fourth filter branches, and adjustable signal feedback means, coupled to said second adder and to said first multipliers of said first and second filter branches, for adjusting the bandwidth of said filter circuit.

6. The filter circuit recited in claim 5, wherein said adjustable signal feedback means comprises an adjustable reference signal voltage source, and a third multiplier having the input terminals thereof coupled to said second adder and said reference signal voltage source and the output terminal thereof coupled to said first multipliers of said first and second filter branches.

7. The filter circuit recited in claim 5, wherein said intermediate frequency filters of said first, second, third and fourth filter branches comprise integrators.

8. The filter circuit recited in claim 5, further comprising an analog-to-digital converter coupled in series between a signal input transmission line and said first multipliers of said first and second filter branches.

9. An electrical current frequency filter circuit, comprising:

first and second parallel coupled filter branches, each of said filter branches including a first multiplier, an intermediate frequency filter, and a second multiplier, respectively, coupled in series, a first signal generator having first and second output terminals coupled to said first and second multipliers of said first and second filter branches, respectively, said signal generator generating two output signals which are linearly independent of each other at a frequency which is equal to that of an input signal to be passed by said filter branches, a first adder, coupled to said second multipliers of said first and second filter branches, third and fourth parallel coupled filter branches, each of said filter branches including a first multiplier, an intermediate frequency filter, and a second multiplier, respectively, coupled in series, a second signal generator, having first and second output terminals coupled to said first and second multipliers of said third and fourth filter branches, respectively, said signal generator generating two output signals which are linearly independent of each other at a frequency which is equal to that of an input signal to be passed by said third and fourth filter branches, and different from said frequency to be passed by said first and second filter branches, a second adder, coupled to said second multipliers of said third and fourth filter branches, the output signal generated by said second adder forming the output signal of said filter circuit, said first adder being coupled to said first multipliers of said third and fourth filter branches, and adjustable signal feedback means, coupled to said second adder and to said first multipliers of said first and second filter branches, for adjusting the bandwidth of said filter circuit.

10. The filter circuit recited in claim 9, wherein said adjustable signal feedback means comprises an adjustable reference signal voltage source, and a third multiplier having the input terminals thereof coupled to said second adder and said reference signal voltage source and the output terminal thereof coupled to said first multipliers of said first and second filter branches.

11. The filter circuit recited in claim 9, wherein said first signal generator comprises a variable frequency signal generator.

12. The filter circuit recited in claim 9, wherein said second signal generator comprises a variable frequency signal generator.

13. The filter circuit recited in claim 9, wherein said intermediate frequency filters of said first, second, third and fourth filter branches comprise integrators.

14. The filter circuit recited in claim 9, further comprising an analog-to-digital converter coupled in series between a signal input transmission line and said first multipliers of said first and second filter branches.

* * * * *